United States Patent [19]

Sugihara et al.

[11] Patent Number: 5,236,889
[45] Date of Patent: Aug. 17, 1993

[54] PROCESS FOR PRODUCING BI-CA-SR-CU-O, TL-CA-SR-CU-O AND TL-BA-CA-CU-O SUPERCONDUCTING CERAMICS

[75] Inventors: Tadashi Sugihara; Takuo Takeshita; Yukihiro Ouchi; Takeshi Sakurai, all of Omiya, Japan

[73] Assignee: Mitsubishi Materials Corporation, Tokyo, Japan

[21] Appl. No.: 445,629

[22] PCT Filed: Feb. 27, 1989

[86] PCT No.: PCT/JP89/00199

§ 371 Date: Nov. 27, 1989

§ 102(e) Date: Nov. 27, 1989

[87] PCT Pub. No.: WO89/08077

PCT Pub. Date: Sep. 8, 1989

[30] Foreign Application Priority Data

Feb. 26, 1988 [JP] Japan ................................ 63-43532
Mar. 31, 1988 [JP] Japan ................................ 63-79785
Apr. 12, 1988 [JP] Japan ................................ 63-89380
May 9, 1988 [JP] Japan ................................ 63-111786
Jul. 22, 1988 [JP] Japan ................................ 63-182975

[51] Int. Cl.$^5$ .................... H01B 12/06; H01L 39/12; C01G 3/00; C04B 41/89
[52] U.S. Cl. ......................................... 505/1; 505/782; 505/783; 505/784; 501/123; 501/126; 264/65
[58] Field of Search .................. 505/1, 782, 783, 784; 501/123, 126; 264/65

[56] References Cited

U.S. PATENT DOCUMENTS 4,880,771 11/1989 Cava et al. .............................. 505/1
4,942,152 7/1990 Itozaki et al. ......................... 505/782
4,962,083 10/1990 Hermann et al. ................... 505/783
5,021,400 6/1991 Block et al. .......................... 505/783
5,066,635 11/1991 Sheng et al. .............................. 505/1

OTHER PUBLICATIONS

Japanese Journal of Applied Physics, vol. 27, No. 4 (Apr. 1988) (Tokyo), (Synthesis of a Tl-Ba.Cu-O Superconductor and Its Properties) pp. L559-L560.

Sheng et al. "Tl$_2$O$_3$ Vapor Process of Making Tl-Ba--Cu-O Superconductors", Apply. Phys. Lett. 53 (26), (1988), pp. 2686-2688.

Gopalakrishnan et al, "Synthesis and Properties of a 125K Superconductor in the Tl-Ca-Ba-Cu-O", Appl. Phy. Lett. 53(5) 1 Aug. 1988 pp. 414-416.

Sheng et al, "Supercontivity in the Rare-Earth-Free Tl-Ba-Cu-O System Above Liquid-Nitrogen Temperature," Nature vol. 332 pp. 55-58 Mar. 3, 1988.

Matsuda et al, "Superconductivity of Tl-Si-Ca-Cu-O System in Relation to Tl-Ba-Ca-Cu-O and Bi-Si--Ca-Cu-O Systems" Jap Jour Appl Phys vol. 27 #11 11, 1988.

Primary Examiner—Mark L. Bell
Assistant Examiner—C. M. Bonnar
Attorney, Agent, or Firm—Cushman, Darby & Cushman

[57] ABSTRACT

1. In the (Bi,Tl)-Ca-(Sr,Ba)-Cu-O based superconducting ceramics production process, a process for preparing superconducting ceramics characterized by
(a) providing powders including
  i) a compound of Bi oxide or Tl oxide,
  ii) a Ca compound,
  iii) an Sr compound or Ba compound, and
  iv) a Cu compound
  as starting powders;
(b) compounding and mixing powders from compounds of the starting powders, the compounds each having lower vapor pressure, i.e., powders from compound ii), compound iii), and compound iv) at a compounding ratio to obtain a mixture, and primarily calcining the mixture at a temperature of 850° to 1050° C., to form a Ca—(Sr,Ba)—Cu—O based oxide; and
(c) further mixing the Ca—(Sr,Ba)—Cu—O based oxide with a compound having a higher vapor pressure, that is, the powder of compound i), at a compounding ratio, and secondarily calcining at a temperature of 500° to 820° C.

9 Claims, No Drawings

5,236,889

PROCESS FOR PRODUCING BI-CA-SR-CU-O, TL-CA-SR-CU-O AND TL-BA-CA-CU-O SUPERCONDUCTING CERAMICS

TECHNICAL FIELD

This invention relates to a process of producing (Bi or Tl)—Ca—(Sr or Ba)—Cu—O based superconducting ceramics, which causes little variation in the composition upon heat treatment such as calcination so that excellent superconducting ceramics materials can be prepared.

BACKGROUND ART

Bi—Ca—Sr—Cu—O based, Tl—Ca—Sr—Cu—O based, Tl—Ca—Ba—Cu—O based and Tl—Ca—Ba—Cu—O based superconducting ceramic materials (hereinafter, abbreviated as (Bi,Tl)—Ca—(Sr,Ba)—Cu—O based superconducting ceramic materials) have recently been proposed. It is well known that these ceramic materials are prepared by a process including the steps of providing starting powders, i.e., powders of Bi oxide ($Bi_2O_3$), Tl oxide ($Tl_2O_3$), Ca carbonate ($CaCO_3$), Sr carbonate ($SrCO_3$) or Ba carbonate ($BaCO_3$), and Cu oxide (CuO), compounding and mixing them in a predetermined compounding ratio to obtain a mixed powder, subjecting the mixed powder repeatedly two or three times to calcining at a temperature of from 700° to 800° C. for a certain retention time and grinding to form a (Bi or Tl)—Ca—(Sr or Ba)—Cu—O based superconducting oxide powder, press-molding the superconducting oxide powder under ordinary conditions, and then sintering the powder.

However, the compositions of (Bi or Tl)—Ca—(Sr or Ba)—Cu—O based superconducting oxide powders prepared by the above—described conventional process tends to vary because volatile components, such as Bi and Tl, evaporate during calcination. This results in inadequate superconducting characteristics.

Also, when a carbonate powder, such as Ca carbonate, Sr carbonate, or Ba carbonate is used as starting powders, carbon remains even after repeated calcination of the powders. It is difficult to reduce the carbon content to 0.5% or less by weight by, for example, 5 repetitions of calcination and grinding. When such high-carbon-content (Bi or Tl)—Ca—(Sr or Ba)—Cu—O based superconducting oxide powder is used as a starting material for preparing superconducting ceramic materials, the carbon residue deposits at grain boundaries during calcination, giving inadequate superconducting characteristics.

DISCLOSURE OF INVENTION

Accordingly, the present inventors have intensively investigated in order to produce (Bi or Tl)—Ca—(Sr or Ba)—Cu—O based superconducting ceramics characterized by little variation of the composition from the foregoing viewpoint, and as a result they have found that when a mixing powder obtained by compounding and mixing low vapor pressure (less-volatile) components of the starting powders, that is, powders of Ca, Sr or) Ba, and Cu compounds in a predetermined compounding ratio is subjected to primary calcination at a high temperature of from 850° to 1050° C. to form complex oxides of Ca, Sr or Ba, and Cu (hereinafter, the oxide being referred to as a Ca—(Sr or Ba)—Cu—O based oxide), the Ca—(Sr or Ba)—Cu—O based oxide does not vary in their compositions upon high temperature calcination because it has no volatile component. Further, it has been found that when a volatile component, e.g., $Bi_2O_3$ powder or $Tl_2O_3$, is compounded and mixed with the Ca—(Sr or Ba)—Cu—O based oxide in a predetermined compounding ratio, and subjected to secondary calcining at a temperature of from 500° to 820° C. a (Bi or Tl)—Ca—(Sr or Ba)—Cu—O based superconducting oxide powder is obtained which has little variation in composition. Furthermore, it has been found that superconducting ceramics materials prepared using the above-obtained superconducting oxide powders as starting material have high superconductivity characteristics.

Also, it has been found that when a carbonate type of compound is used as the low vapor pressure component, Ca—(Sr or Ba)—Cu—O based oxides produced by this method contain little or no carbon because the carbonate compound is completely decomposed in a high temperature calcination treatment, that a (Bi or Tl)—Ca—(Sr or Ba)—Cu—O based superconducting oxide powder of remarkably low carbon content is obtained by mixing the Ca—(Sr or Ba)—Cu—O based oxides with a volatile oxide—containing compounds in a predetermined compounding ratio to obtain a mixture and then subjecting the mixture to secondary calcining. The superconducting ceramic materials produced from the thus-obtained (Bi or Tl)—Ca—(Sr or Ba)—Cu—O based superconducting oxide powder as a starting material have higher values for critical current (Jc) and critical temperature (Tc) because there occurs no deterioration of their superconducting characteristics which is ascribable to presence of carbon.

This invention was made on the basis of the above—described knowledge, and provides a (Bi or Tl)—Ca—(Sr or Ba)—Cu—O based superconducting ceramics production process, comprising (a) providing starting powders including i) a powder of one compound selected from Bi oxide and Tl oxide, ii) a powder of Ca compound, iii) a powder of one compound selected from Sr compound and Ba compound, and iv) a powder of Cu oxide;

(b) compounding and mixing components of the starting powders, i.e. the powders ii), iii) and iv) in a predetermined compounding ratio to obtain a mixed powder, subjecting the mixed powder to primary calcination at a temperature of from 850° to 1050° C. to form a Ca—(Sr or Ba)—Cu—O based oxide; and (c) further compounding and mixing the Ca—(Sr or Ba)—Cu—O based oxide with a high vapor pressure component, i.e., the powders of compound i) to obtain a mixed powder, subjecting the mixed powder to secondary calcining at a predetermined temperature of from 500° to 820° C.

BEST MODE FOR CARRYING OUT THE INVENTION

Compounds in ii) suitable for use include CaO, $CaCO_3$ and the like. Compounds in iii) suitable for use include SrO, BaO, $SrCO_3$, $BaCO_3$ and the like.

The particle size of each starting powders may be as large as that used in the production of conventional superconducting oxide powders or superconducting ceramics, for example, 2 to 10 μm, preferably 6 to 7 μm.

Each starting powders should preferably be as pure as possible; 99.99% purity is commonly used.

The primary calcination is performed in the air or occasionally in a suitable atmosphere such as inert gas, Tl vapor or the like, at a predetermined primary calcination temperature, for a retention time of from 1 to 30 hours, usually from 5 to 15 hours to form the Ca—(Sr or Ba)—Cu—O based oxide after the steps of compounding low vapor pressure components in a predetermined compounding ratio, wet-mixing them for 30 minutes to 8 hours by virtue of mixing means such as ball—milling, drying the mixture, and then placing the mixture in a vessel made of, for example, alumina.

The Ca—(Sr or Ba)—Cu—O based oxide is mixed with powder of compound i) to obtain a mixture, and the mixture is subjected to wet—mixing for 30 minutes to 8 hours, usually about 3 hours, by virture of mixing means such as ball-milling and then drying. Next, the secondary calcination of the mixture is performed for 30 minutes to 10 hours in the air.

In the process of producing superconducting ceramics according to the present invention, the superconducting ceramics may be produced as superconducting oxide powders or pressed bodies produced by pressurization and heat-treatment. The pressurization and heat-treatment may be performed serially by subjecting the superconducting ceramics to press-molding and then heat-treatment (secondary calcination), or simultaneously by conducting hot-press at a temperature which corresponds to temperature of the secondary calcination.

The Ca—(Sr or Ba)—Cu—O based oxide may be mixed with compound i) without pre-treatment, but it is preferable to grind the above-described oxide before mixing.

The primary calcination temperature is set up in the range of from 850° C. to 1050° C. because when the temperature is lower than 850° C., the complex oxide forms insufficiently and the carbonate used as a starting material decomposes insufficiently; thus, it is unavoidable that a relatively large amount of carbon remains, which eventually causes deterioration of the characteristics of the superconducting ceramics material. On the other hand, when the temperature is higher than 1050° C., CuO melts and it is impossible to form homogeous Ca—(Sr or Ba)—Cu—O based oxide.

The secondary calcination temperature is limited to between 400° C. and 890° C. because when the temperature is lower than 400° C., the reaction between compound i) and the Ca—(Sr or Ba)—Cu—O based oxide proceeds insufficiently so that the superconducting oxide powder or the superconducting ceramics is not formed. On the other hand, when the temperature is higher than 890° C., the compound i) melts with the result the above-described reaction takes place too heterogeneously to form the superconducting oxide powders, or the sintered material is softened so that the superconducting ceramics can no longer be formed.

More specifically, taking the above description into account, appropriate secondary calcination temperature is in the range of from 500° to 820° C. when $Bi_2O_3$ is used as compound i). The temperature is in the range of from 400° C. to 720° C. when $Tl_2O_3$ is used as compound i). Furthermore, in the case of pressurization and heat treatment, appropriate secondary calcination temperature, that is, sintering or hot-pressing temperature, is in the range of from 500° C. to 890° C. when $Bi_2O_3$ is used as compound i), and in the range of from 400° C. to 890° C. when $Tl_2O_3$ is used as compound i).

The pressurization and heat treatment are performed by conducting press-molding under the pressure of from 1 to 5 ton/cm² to form pressed bodies, and subjecting the pressed bodies to heat-treatment in the air, at a temperature of 400° C. to 890° C., for a retention time of usually 1 to 10 hours. Also, the pressurization and heat-treatment are performed by heating at a heating rate of 10° to 300° C./hr under the pressure of 50 to 300 kg/cm², and then hot-pressing at a temperature of 400° C. to 890° C. for a retention time of usually 1 to 10 hours. The hot-pressed treatment is performed in vacuum or atmosphere of inert gas such as Ar and the like. Use of inert gas is preferable when $Tl_2O_3$ is used as compound i).

PREFERRED EMBODIMENTS

Next, the process of producing (Bi or Tl)—Ca—(Sr or Ba)—Cu—O based superconducting ceramics according to this invention will be concretely explained with reference to the following examples.

EXAMPLE 1

As starting powders, $CaCO_3$ powder, $SrCO_3$ powder and $Bi_2O_3$ powder, each having an average grain size of 7 μm, and each being purified at 99.9%, are provided. $CaCO_3$, $SrCO_3$, and CuO powders are compounded in compounding compositions shown in Table 1. The compounded powders are subjected to wet—mixing in ball mill for 3 hours, drying, placing in an alumina vessel and primary calcination in the air at a temperature shown in Table 1 for a retention time of 5 hours to form Ca—Sr—Cu—O based oxide. Next, the Ca—Sr—Cu—O based oxide is compounded with $Bi_2O_3$ powder at a compounding ratio (100% by weight in total) shown in Table 1, subjected to wet—mixing in the ball mill for 3 hours, drying, secondary calcination in the air at the temperatures shown in Table 1 for a retention time of 10 hours, to prepare Bi—Ca—Sr—Cu—O based superconducting oxide powder (hereinafter, referred simply to as superconducting oxide powders) having the carbon contents shown in Table 1. Processes 1 to 8 according to the present invention and comparative processes 1 to 4 are conducted in accordance with these procedures. But the primary and secondary calcination temperatures in the comparative processes 1 to 4 deviated from the scope of this invention.

For comparison, the above-described starting powders are compounded at weight ratios of $CaCO_3$: 16.5%, $SrCO_3$: 23.1%, CuO: 24.9%, and $Bi_2O_3$: 36.4%, and mixed for 5 hours to obtain a mixture. The mixture is subjected to drying, retaining at a temperature of 800° C. for 10 hours in the air, and grinding (the above-described three steps being defined as one cycle). The same procedure is repeated 5 times in the conventional process to obtain a superconducting oxide powder having carbon contents as shown in Table 1.

Next, various kinds of the thus—obtained superconducting oxide powder are used as starting powders. The powders are subjected to press-molding under the pressure of 2 ton/cm² to form pressed bodies, sintering in the air at a temperature of 860° C. for a retention time of 10 hours, to form superconducting ceramic materials having dimensions of 5 mm×5 mm in cross—section and 10 mm in length. The critical current (Jc) and critical temperature (Tc) are measured. The results obtained are shown in Table 1.

EXAMPLE 2

The same procedures as Example 1 are repeated to prepare Tl—Ca—Sr—Cu—O based superconducting oxide powders except that conditions are as shown in Table 2, and that $Tl_2O_3$ is used instead of $Bi_2O_3$.

The primary and secondary calcination temperatures in comparative examples 1 to 4 deviated from the scope of the present invention.

For comparison, the same procedures as each of the comparative examples of Example 1 are repeated to prepare superconducting oxide powders having carbon contents as shown in Table 2 except that the above-described starting powders are compounded at a compounding ratio of $CaCO_3$: 16.8%, $SrCO_3$: 24.8%, CuO: 20.0%, $Tl_2O_3$: 38.4% by weight.

Next, each of the thus—obtained superconducting oxide powders is used as starting powders. The powders are subjected to press-molding at the pressure of 2 ton/cm² to form pressed bodies, and the pressed bodies are subjected to sintering in the air at a temperature of 860° C. for a retention time of 10 hours, to prepare superconducting ceramic materials each having dimensions of 5 mm×5 mm in cross section and 10 mm in length. The critical current (Jc) and critical temperature (Tc) are measured, and the results obtained are shown in Table 2.

EXAMPLE 3

The same procedures as Example 1 are repeated to form Ca—Sr—Cu—O based oxide except that conditions are shown in Table 3. Next, the Ca—Sr—Cu—O based oxide is ground to form a powder having an average grain size of 5 μm.

(a) Sintering

A mixture of Ca—Sr—Cu—O based oxide powder and $Bi_2O_3$ powder, having blend compositions shown in processes 1 to 8 of the present invention and comparative processes 1 to 4 in Table 3, is subjected to press-molding at the pressure of 2 ton/cm² and then sintering in the air under the conditions of temperatures and retention time shown in Table 1, to prepare superconducting ceramics having dimensions of a cross-section of 5 mm×5 mm and a length of 10 mm.

(b) Hot pressing

The same mixture as used in the above-described sintering step is placed in the mold for a hot press. The mixture is heated at a heating rate of 100° C./hr under the pressure of 150 kg/cm², then hot-pressed at the temperatures and retention time shown in Table 3, and cooled in a furnace, to prepare the superconducting ceramics having dimensions of cross-section of 5 mm×5 mm and length of 10 mm.

In comparative processes 1 to 4, the calcination temperature of Ca—Sr—Cu—O based oxide powder and the sintering or hot-pressing temperature of Ca—Sr—Cu—O based oxide powder mixed with $Bi_2O_3$ deviated from the scope of this invention. An asterisk is attached to values deviating from the scope of this invention.

Furthermore, for comparison, the superconducting ceramics having dimensions of cross-section 5 mm×5 mm and length 10 mm are prepared by a conventional process including the steps: compounding the above-described starting powders at the compounding ratio of $CaCO_3$: 15.6%, $SrCO_3$: 23.1%, CuO: 24.9%, and $Bi_2O_3$: 36.4% by weight, mixing for 5 hours to obtain a mixture, subjecting the mixture to drying, heating in the air at a temperature of 800° C. for a retention time of 10 hours, grinding and hot-pressing the obtained Bi—Ca—Sr—Cu—O based oxide powder to form pressed bodies, and sintering the pressed bodies in the air at a temperature of 880° C. for a retention time of 3 hours.

The carbon content, critical current Jc (A/cm²), and critical temperature Tc (°K) of the superconducting ceramics are measured, the ceramics being prepared by above-mentioned process of the present invention, comparative process and conventional process, and the results are shown in Table 3.

EXAMPLE 4

As starting powders, $CaCO_3$, $BaCO_3$, CuO, and $Tl_2O_3$ powders, each having an average grain size of 6 μm and a purity of 99.9%, are provided. Among these, $CaCO_3$ powder, $BaCO_3$ powder, and CuO powder are compounded to have compounding compositions shown in Table 4, wet-mixed in a ball mill for 5 hours, and dried to obtain a dried powder The dried powder is placed in an alumina vessel, primarily calcined in the air, at various temperatures shown in Table 4, for a retention time of 5 hours to form Ca—Ba—Cu—O based oxides. Subsequently, the Ca—Ba—Cu—O based oxides is mixed with $Tl_2O_3$ powder in ratios (100% by weight in total) shown in Table 4, wet—mixed in a ball mill for 5 hours and dried to obtain a dried powder, and the dried powder is secondarily calcined in the air at various temperatures shown in Table 4 for a retention time of 10 hours to perform processes 1 to 8 of this invention and comparative processes 1 to 4, respectively, and thereby preparing Tl—Ca—Ba—Cu—O based superconducting oxide powder (hereinafter, referred to as superconducting oxide powder) having the carbon contents shown in Table 4.

In comparative processes 1 to 4, the primary and secondary calcination temperatures are deviated from the scope of this invention.

Also, for comparison, the above-described starting powders are compounded at a compounding ratio of $CaCO_3$: 15.5%, $BaCO_3$: 30.6%, CuO: 18.5%, $Tl_2O_3$: 35.4% (% by weight), and then mixed for 5 hours to obtain a mixture. The mixture is subjected to drying, heating in the air at a temperature of 680° C. for a retention time of 10 hours, and grinding (the above-described three steps being defined as one cycle). The cycles are repeated 5 times in the conventional process to prepare superconducting oxide powders having carbon contents as shown in Table 4.

Next, the thus-obtained superconducting oxide powders are used as starting powders, and press-molded at a pressure of 2 ton/cm² to obtain pressed bodies. The pressed bodies are sintered in the air at a temperature of 890° C. for a retention time of 10 hours, to form superconducting ceramics materials having dimensions of cross section 5 mm×5 mm and length 10 mm. The critical current (Jc) and critical temperature (Tc) of these superconducting ceramics materials are measured, and the results are shown in Table 4.

EXAMPLE 5

The same procedures as Example 4 are repeated to form Ca—Ba—Cu—O based oxide except that another procedures are performed under the conditions shown in Table 5, the average grain size of the starting powder is controlled to 7 μm, and that the wet—mixing operation is performed for 3 hours. The thus-obtained Ca—Ba—Cu—O based oxide is ground to prepare Ca—Ba—Cu—O based oxide powders having an average grain size of 5 μm.

The above-described Ca—Ba—Cu—O based oxide powder is mixed with Tl$_2$O$_3$ powder, having an average grain size of 7 μm, at the mixing ratio (100% by weight in total) shown in Table 5, wet—mixed in a ball mill for 3 hours and dried to obtain a dried powder. The dried powder is used for preparing Tl—Ca—Ba—Cu—O based superconducting ceramics (hereinafter, referred to as superconducting ceramics) by the following steps:

(a) Sintering

A mixture of Ca—Ba—Cu—O based oxide powder and Tl$_2$O$_3$ powder having blend compositions shown in processes 1 to 8 of this invention and comparative processes 1 to 4 is press-molded at the pressure of 2 ton/cm$^2$ to obtain pressed bodies. The pressed bodies are sintered in the air under the conditions of the temperatures and retention time shown in Table 5 to prepare superconducting ceramics of cross section 5 μm×5 mm and length 10 mm, (b) Hot pressing The same mixture as used in the previous sintering step is placed in a hot-press mold, heated at a heating rate of 100° C./hr under the pressure of 150 kg/cm$^2$, hot-pressed under the conditions of the temperatures and retention time shown in Table 5, and then cooled in a furnace to form superconducting ceramics having dimensions of cross section 5 mm×5 mm and length 10 mm.

In comparative processes 1 to 4, the calcination temperature of the Ca—Ba—Cu—O based oxide powders and the sintering or hot-pressing temperatures of the Ca—Ba—Cu—O based oxide powders mixed with Tl$_2$O$_3$ deviated from the scope of this invention. An asterisk is attached to values deviating from the scope of this invention.

Furthermore, for comparison, the above-described starting powders are compounded at a compounding ratio of CaCO$_3$: 15.5%, BaCO$_3$: 30.6%, CuO: 18.5%, and Tl$_2$O$_3$: 35.4% by weight, and mixed for 5 hours to obtain a mixture. The mixture is subjected to drying, heating in the air at a temperature of 700° C. for a retention time of 10 hours, and grinding to form Tl—Ca—Ba—Cu—O based oxide powder. The obtained Tl—Ca—Ba—Cu—O based oxide powder is press-molded to obtain pressed bodies, heated in the air at a heating rate of 20° C./hr, and then sintered at a temperature of 880° C. for a retention time of 3 hours to prepare superconducting ceramics of cross section 5 mm×5 mm and length 10 mm by means of the conventional process.

The carbon content, critical current Jc (A/cm$^2$), and critical temperature Tc (°K) of the superconducting ceramics are measured, the ceramics being prepared by above-mentioned process of the present invention, comparative process and conventional process, and the results are shown in Table 5.

As clearly seen from Tables 1 to 5, the superconducting ceramics prepared by the process of the present invention have lower carbon content and thereby indicate superior superconducting characteristics to those prepared by the conventional processes On the other hand, when conditions deviate significantly from the scope of the present invention, considerable amounts of carbon remain in the superconducting ceramics, or a definite shape of the superconducting ceramics cannot be obtained because of softening. In such cases, the obtained superconducting ceramics cannot have excellent superconducting characteristics.

TABLE 1

| Run No. | Composition of Ca—Sr—Cu—O based oxide (% by weight) | | | Primary Calcination Temperature (°C.) | Compounding Ratio of Bi$_2$O$_3$ (% by weight) |
|---|---|---|---|---|---|
| | CaCO$_3$ | SrCO$_3$ | CuO | | |
| P.I. - 1 | 15.1 | 22.2 | 16.0 | 850 | 46.7 |
| 2 | 15.6 | 23.1 | 24.9 | 920 | 36.4 |
| 3 | 9.8 | 28.9 | 15.6 | 980 | 45.7 |
| 4 | 7.5 | 33.4 | 24.0 | 1050 | 35.1 |
| 5 | 9.1 | 26.8 | 21.7 | 950 | 42.4 |
| 6 | 16.7 | 24.6 | 19.9 | 950 | 38.8 |
| 7 | 19.0 | 14.0 | 22.7 | 950 | 44.3 |
| 8 | 8.0 | 35.5 | 19.1 | 950 | 37.3 |
| Comp - 1 | 15.1 | 22.2 | 16.0 | 800* | 46.7 |
| 2 | 15.6 | 23.1 | 24.9 | 1080* | 36.4 |
| 3 | 9.1 | 26.8 | 21.7 | 950 | 42.4 |
| 4 | 16.7 | 24.6 | 19.9 | 950 | 38.8 |
| Conv | — | — | — | — | — |

| Run No. | Secondary Calcination Temperature (°C.) | Carbon Content of Superconducting oxide powder (% by weight) | Superconducting Ceramics Material | |
|---|---|---|---|---|
| | | | Jc (A/cm$^2$) | Tc (°K.) |
| P.I. - 1 | 750 | 0.2 | 30 | 62 |
| 2 | 750 | 0.1 | 55 | 78 |
| 3 | 750 | 0.1 | 23 | 68 |
| 4 | 750 | 0.1 | 50 | 65 |
| 5 | 500 | 0.2 | 17 | 55 |
| 6 | 600 | 0.1 | 14 | 57 |
| 7 | 700 | 0.1 | 35 | 68 |
| 8 | 820 | 0.1 | 27 | 72 |
| Comp - 1 | 750 | 2.0 | 0.5 | 40 |
| 2 | 750 | 0.1 | I.M. | I.M. |
| 3 | 460* | 0.1 | 0.1 | 35 |
| 4 | 850* | 0.1 | I.M. | I.M. |
| Conv | — | 3.0 | 1.5 | 45 |

Note:
"P.I." stands for "Process according to Present Invention".
"Comp" stands for "Comparative Process".
"Conv" stands for "Conventional Process".
Asterisks indicate conditions beyond the scope of the present invention.
"I.M." stands for "Impossible to measure".

TABLE 2

| Run No. | Composition of Ca—Sr—Cu—O based oxide (% by weight) | | | Primary Calcination Temperature (°C.) | Compounding Ratio of Tl$_2$O$_3$ (% by weight) |
|---|---|---|---|---|---|
| | CaCO$_3$ | SrCO$_3$ | CuO | | |
| P.I. - 1 | 16.8 | 24.8 | 20.0 | 850 | 38.4 |
| 2 | 26.3 | 12.9 | 20.9 | 930 | 39.9 |
| 3 | 20.8 | 15.3 | 16.5 | 970 | 47.4 |
| 4 | 15.2 | 22.4 | 16.1 | 1050 | 46.3 |
| 5 | 13.4 | 19.7 | 21.2 | 950 | 45.7 |
| 6 | 14.9 | 22.0 | 12.0 | 940 | 51.1 |
| 7 | 17.9 | 26.4 | 28.5 | 940 | 27.2 |
| 8 | 19.8 | 29.2 | 20.9 | 940 | 30.1 |
| Comp - 1 | 16.8 | 24.8 | 20.0* | 800* | 38.4 |
| 2 | 26.3 | 12.9 | 20.9* | 1080* | 39.9 |
| 3 | 20.8 | 15.3 | 16.5 | 950 | 47.4 |
| 4 | 15.2 | 22.4 | 16.1 | 950 | 46.3 |
| Conv | — | — | — | — | — |

| Run No. | Secondary Calcination Temperature (°C.) | Carbon Content of Superconducting oxide powder (% by weight) | Superconducting Ceramics Material | |
|---|---|---|---|---|
| | | | Jc (A/cm$^2$) | Tc (°K.) |
| P.I. - 1 | 680 | 0.1 | 103 | 78 |
| 2 | 680 | 0.1 | 63 | 75 |
| 3 | 680 | <0.1 | 77 | 70 |
| 4 | 680 | <0.1 | 92 | 72 |
| 5 | 400 | 0.1 | 43 | 65 |
| 6 | 500 | 0.1 | 56 | 68 |
| 7 | 720 | <0.1 | 28 | 60 |
| 8 | 620 | <0.1 | 37 | 58 |

TABLE 2-continued

| | | | | |
|---|---|---|---|---|
| Comp - 1 | 680 | 2.5 | 1.0 | 50 |
| 2 | 680 | 0.1 | I.M. | I.M. |
| 3 | 360* | 0.1 | 0.1 | 47 |
| 4 | 750* | 0.1 | I.M. | I.M. |
| Conv | — | 3.5 | 0.7 | 52 |

Note:
"P.I." stands for "Process according to Present Invention".
"Comp" stands for "Comparative Process".
"Conv" stands for "Conventional Process".
Asterisks indicate conditions beyond the scope of the present invention.
"I.M." stands for "Impossible to measure".

TABLE 3

| Run No. | Composition of Ca—Sr—Cu—O based oxide (% by weight) | | | Calcination Temperature of Ca—Sr—Cu—O based oxide (°C.) | Compounding Ratio of $Bi_2O_3$ (% by weight) |
|---|---|---|---|---|---|
| | $CaCO_3$ | $SrCO_3$ | CuO | | |
| P.I. - 1 | 15:1 | 22.2 | 16.0 | 850 | 46.7 |
| 2 | 15.6 | 23.1 | 24.9 | 920 | 36.4 |
| 3 | 9.8 | 28.9 | 15.6 | 980 | 45.7 |
| 4 | 7.5 | 33.4 | 24.0 | 1050 | 35.1 |
| 5 | 9.1 | 26.8 | 21.7 | 950 | 42.4 |
| 6 | 16.7 | 24.6 | 19.9 | 950 | 38.8 |
| 7 | 19.0 | 14.0 | 22.7 | 950 | 44.3 |
| 8 | 8.0 | 35.5 | 19.1 | 950 | 37.3 |
| Comp - 1 | 15.1 | 22.2 | 16.0 | 800* | 46.7 |
| 2 | 15.6 | 23.1 | 24.9 | 1080* | 36.4 |
| 3 | 9.1 | 26.8 | 21.7 | 950 | 42.4 |
| 4 | 16.7 | 24.6 | 19.9 | 950 | 38.8 |
| Conv | — | — | — | — | — |

| Run No. | Production of Superconducting Ceramics & the conditions | | | Superconductive Characteristics | | |
|---|---|---|---|---|---|---|
| | Production Processes | Temperature (°C.) | Retention Time (hour) | Carbon Content (% by weight) | Jc ($A/cm^2$) | Tc (°K.) |
| P.I. - 1 | Sintering | 770 | 5 | 0.1 | 27 | 77 |
| | Hot-pressing | 770 | 3 | 0.1 | 16 | 76 |
| 2 | Sintering | 850 | 3 | 0.1 | 35 | 73 |
| | Hot-pressing | 850 | 2 | 0.1 | 17 | 75 |
| 3 | Sintering | 650 | 10 | 0.2 | 12 | 70 |
| | Hot-pressing | 650 | 5 | 0.2 | 5 | 72 |
| 4 | Sintering | 570 | 15 | 0.2 | 10 | 69 |
| | Hot-pressing | 570 | 5 | 0.2 | 6 | 65 |
| 5 | Sintering | 510 | 24 | 0.2 | 3 | 68 |
| | Hot-pressing | 510 | 10 | 0.3 | 1 | 67 |
| 6 | Sintering | 880 | 3 | 0.1 | 25 | 78 |
| | Hot-pressing | 880 | 3 | 0.1 | 18 | 75 |
| 7 | Sintering | 720 | 8 | 0.1 | 17 | 76 |
| | Hot-pressing | 720 | 3 | 0.1 | 15 | 77 |
| 8 | Sintering | 750 | 5 | 0.1 | 27 | 73 |
| | Hot-pressing | 750 | 3 | 0.1 | 11 | 72 |
| Comp - 1 | Sintering | 770 | 3 | 2.0 | <0.1 | 43 |
| | Hot-pressing | 770 | 3 | 2.3 | <0.1 | 45 |
| 2 | Sintering | 770 | 3 | 0.1 | — | — |
| | Hot-pressing | 770 | 3 | 0.1 | — | — |
| 3 | Sintering | 460* | 24 | 0.1 | — | — |
| | Hot-pressing | 460* | 10 | 0.1 | — | — |
| 4 | Sintering | 900* | 3 | 0.1 | <0.1 | 15 |
| | Hot-pressing | 900* | 3 | 0.1 | <0.1 | 20 |
| Conv | — | — | — | 3.5 | 2.7 | 55 |

Note:
"P.I." stands for "Process according to Present Invention".
"Comp" stands for "Comparative Process".
"Conv" stands for "Conventional Process".
Asterisks indicate conditions beyond the scope of the present invention.

TABLE 4

| Run No. | Composition of Ca—Ba—Cu—O based oxide (% by weight) | | | Primary Calcination Temperature (°C.) | Compounding Ratio of $Tl_2O_3$ (% by weight) |
|---|---|---|---|---|---|
| | $CaCO_3$ | $BaCO_3$ | CuO | | |
| P.I. - 1 | 15.5 | 30.6 | 18.5 | 880 | 35.4 |
| 2 | 25.2 | 16.5 | 20.0 | 850 | 38.3 |
| 3 | 19.8 | 19.5 | 15.7 | 980 | 45.0 |
| 4 | 14.1 | 27.9 | 15.0 | 1050 | 43.0 |
| 5 | 12.5 | 24.7 | 19.9 | 950 | 42.9 |
| 6 | 13.9 | 27.4 | 11.1 | 900 | 47.6 |
| 7 | 16.4 | 32.4 | 26.2 | 900 | 25.0 |
| 8 | 18.0 | 35.5 | 19.1 | 900 | 27.4 |
| Comp - 1 | 15.5 | 30.6 | 18.5 | 780* | 35.4 |
| 2 | 25.2 | 16.5 | 20.0 | 1080* | 38.3 |
| 3 | 19.8 | 19.5 | 15.7 | 930 | 45.0 |
| 4 | 14.1 | 27.9 | 15.0 | 930 | 43.0 |
| Conv | — | — | — | — | — |

| Run No. | Secondary Calcination Temperature (°C.) | Carbon Content of Superconducting oxide powder (% by weight) | Superconducting Ceramics Material | |
|---|---|---|---|---|
| | | | Jc ($A/cm^2$) | Tc (°K.) |
| P.I. - 1 | 700 | 0.1 | 98 | 77 |
| 2 | 700 | 0.2 | 54 | 76 |
| 3 | 700 | <0.1 | 65 | 73 |
| 4 | 700 | <0.1 | 75 | 71 |
| 5 | 400 | <0.1 | 36 | 64 |
| 6 | 510 | 0.1 | 43 | 69 |
| 7 | 720 | 0.1 | 17 | 62 |
| 8 | 600 | 0.1 | 29 | 66 |
| Comp - 1 | 700 | 2.0 | 2.5 | 47 |
| 2 | 700 | <0.1 | I.M. | I.M. |
| 3 | 360* | 0.1 | 4.0 | 41 |
| 4 | 750* | 0.1 | I.M. | I.M. |

TABLE 4-continued

| Conv | — | 4.0 | 1.0 | 50 |

Note:
"P.I." stands for "Process according to Present Invention".
"Comp" stands for "Comparative Process".
"Conv" stands for "Conventional Process".
Asterisks indicate conditions beyond the scope of the present invention.
"I.M." stands for "Impossible to measure".

TABLE 5

| Run No. | Composition of Ba—Ca—Cu—O based oxide (% by weight) | | | Calcination Temperature of Ba—Ca—Cu—O based oxide (°C.) | Compounding Ratio of $Tl_2O_3$ (% by weight) |
|---|---|---|---|---|---|
| | $BaCO_3$ | $CaCO_3$ | CuO | | |
| P.I. - 1 | 30.6 | 15.5 | 18.5 | 860 | 35.4 |
| 2 | 16.5 | 25.2 | 20.0 | 800 | 38.3 |
| 3 | 19.5 | 19.8 | 15.7 | 950 | 45.0 |
| 4 | 27.9 | 14.1 | 15.0 | 1040 | 43.0 |
| 5 | 24.7 | 12.5 | 19.9 | 930 | 42.9 |
| 6 | 27.4 | 13.9 | 11.1 | 850 | 47.6 |
| 7 | 32.4 | 16.4 | 26.2 | 1000 | 25.0 |
| 8 | 35.5 | 18.0 | 19.1 | 980 | 27.4 |
| Comp - 1 | 30.6 | 15.5 | 18.5 | 770* | 35.4 |
| 2 | 16.5 | 25.2 | 20.0 | 1070* | 38.3 |
| 3 | 19.5 | 19.8 | 15.7 | 930 | 45.0 |
| 4 | 27.9 | 14.1 | 15.0 | 930 | 43.0 |
| Conv | — | — | — | — | — |

| Run No. | Production of Superconducting Ceramics & the conditions | | | Superconductive Characteristics | | |
|---|---|---|---|---|---|---|
| | Production Processes | Temperature (°C.) | Retention Time (hour) | Carbon Content (% by weight) | Jc (A/cm$^2$) | Tc (°K.) |
| P.I. - 1 | Sintering | 730 | 5 | <0.1 | 30 | 86 |
| | Hot-pressing | 730 | 3 | <0.1 | 16 | 87 |
| 2 | Sintering | 860 | 3 | <0.1 | 37 | 83 |
| | Hot-pressing | 860 | 2 | <0.1 | 21 | 84 |
| 3 | Sintering | 630 | 10 | <0.1 | 10 | 79 |
| | Hot-pressing | 630 | 5 | <0.1 | 8 | 82 |
| 4 | Sintering | 480 | 16 | 0.1 | 13 | 81 |
| | Hot-pressing | 480 | 10 | 0.1 | 11 | 82 |
| 5 | Sintering | 420 | 30 | 0.2 | 4 | 77 |
| | Hot-pressing | 420 | 15 | 0.2 | 2 | 75 |
| 6 | Sintering | 890 | 3 | <0.1 | 31 | 87 |
| | Hot-pressing | 890 | 3 | <0.1 | 26 | 89 |
| 7 | Sintering | 650 | 10 | <0.1 | 16 | 89 |
| | Hot-pressing | 650 | 3 | <0.1 | 17 | 85 |
| 8 | Sintering | 700 | 5 | <0.1 | 19 | 84 |
| | Hot-pressing | 700 | 3 | <0.1 | 18 | 82 |
| Comp - 1 | Sintering | 680 | 6 | 2.0 | <0.1 | 37 |
| | Hot-pressing | 680 | 3 | 3.0 | <0.1 | 46 |
| 2 | Sintering | 680 | 6 | <0.1 | — | — |
| | Hot-pressing | 680 | 3 | <0.1 | — | — |
| 3 | Sintering | 380* | 30 | 0.1 | — | — |
| | Hot-pressing | 380* | 15 | 0.1 | — | — |
| 4 | Sintering | 910* | 3 | 0.1 | <0.1 | 29 |
| | Hot-pressing | 910* | 3 | 0.1 | <0.1 | 26 |
| Conv | — | — | — | 3.0 | 1.5 | 63 |

Note:
"P.I." stands for "Process according to Present Invention".
"Comp" stands for "Comparative Process".
"Conv" stands for "Conventional Process".
Asterisks indicate conditions beyond the scope of the present invention.

As detailed above, the preparation method of the present invention provides superconducting ceramics that are superior to those produced by conventional methods.

INDUSTRIAL APPLICABILITY

According to the superconducting ceramics production process of the present invention, the carbon content of the prepared superconducting ceramics is extremely low. The process is effective for preparing superconducting ceramics having excellent superconducting characteristics.

What is claimed is:

1. A process for producing Bi—Ca—Sr—Cu—O based superconducting ceramics consisting essentially of:

(a) preparing four starting powders, namely:
  i) a bismuth oxide,
  ii) a calcium carbonate,
  iii) a strontium carbonate, and
  iv) a copper oxide;

(b) measuring said starting powders at a mole ratio of 1 : 0.5–1.5 : 0.5–1.5 : 0.5–1.5 between said bismuth oxide powder : said calcium carbonate powder : said strontium carbonate powder : said copper oxide powder;

(c) mixing said measured calcium carbonate powder, said measured strontium carbonate powder and said measured copper oxide powder to provide a second powder;

(d) primarily calcining said second powder at a temperature of 850° C. to 1050° C. to form a Ca—Sr—Cu—O based oxide, (e) mixing said measured bismuth oxide powder and a powdered said Ca—Sr—Cu—O based oxide from step (d) to provide a third powder; and
(f) secondarily calcining said third powder at a temperature of 500° C. to 820° C.

2. A process for producing Bi—Ca—Sr—Cu—O based superconducting ceramics consisting essentially of:
(a) preparing four starting powders, namely:
  i) a bismuth oxide,
  ii) a calcium carbonate,
  iii) a strontium carbonate, and
  iv) a copper oxide;
(b) measuring said starting powders at a mole ratio of 1 : 0.5–1.5 : 0.5–1.5 : 0.5–1.5 between said bismuth oxide powder : said calcium carbonate powder : said strontium carbonate powder : said copper oxide powder;
(c) mixing said measured calcium carbonate powder, said measured strontium carbonate powder and said measured copper oxide powder to provide a second powder;
(d) primarily calcining said second powder at a temperature of 850° C. to 1050° C. to form a Ca—Sr—Cu—O based oxide,
(e) mixing said measured bismuth oxide powder and a powdered said Ca—Sr—Cu—O based oxide from step (d) to provide a third powder;
(f) secondarily calcining said third powder at a temperature of 500° C. to 820° C. to form a Bi—Ca—Sr—Cu—O based superconducting oxide powder;
(g) press-molding said Bi—Ca—Sr—Cu—O based superconducting oxide powder to form a pressed body; and
(h) thirdly calcining said pressed body at a temperature of 400° C. to 890° C.

3. A process for producing Bi—Ca—Sr—Cu—O based superconducting ceramics consisting essentially of:
(a) preparing four starting powders, namely:
  (i) a bismuth oxide,
  ii) a calcium carbonate,
  iii) a strontium carbonate, and
  iv) a copper oxide;
(b) measuring said starting powders at a mole ratio of 1 : 0.5–1.5 : 0.5–1.5 : 0.5–1.5 between said bismuth oxide powder : said calcium carbonate powder : said strontium carbonate powder : said copper oxide powder;
(c) mixing said measured calcium carbonate powder, said measured strontium carbonate powder and said measured copper oxide powder to provide a second powder;
(d) primarily calcining said second powder at a temperature of 850° C. to 1050° C. to form a Ca—Sr—Cu—O based oxide;
(e) mixing said measured bismuth oxide powder and a powdered said Ca—Sr—Cu—O based oxide from step (d) to provide a third powder;
(f) secondarily calcining said third powder at a temperature of 500° C. to 820° C. to form a Bi—Ca—Sr—Cu—O based superconducting oxide powder; and
(g) hot-molding said Bi—Ca—Sr—Cu—O based superconducting oxide powder under the pressure of 50 to 300 kg/cm² and at a temperature of 400° C. to 890° C.

4. A process for producing Tl—Ca—Sr—Cu—O based superconducting ceramics consisting essentially of:
(a) preparing four starting powders, namely:
  i) a thallium oxide,
  ii) a calcium carbonate,
  iii) a strontium carbonate, and
  iv) a copper oxide;
(b) measuring said starting powders at a mole ratio of 1 : 0.67–1.5 : 0.5–1.5 : 0.67–3.0 between said thallium oxide powder : said calcium carbonate powder : said strontium carbonate powder : said copper oxide powder;
(c) mixing said measured calcium carbonate powder, said measured strontium carbonate powder and said measured copper oxide powder to provide a second powder;
(d) primarily calcining said second powder at a temperature of 850° C. to 1050° C. to form a Ca—Sr—Cu—O based oxide;
(e) mixing said measured bismuth oxide powder and a powdered said Ca—Sr—Cu—O based oxide from step (d) to provide a third powder; and
(f) secondarily calcining said third powder at a temperature of 400° C. to 720° C.

5. A process for producing Tl—Ca—Sr—Cu—O based superconducting ceramics consisting essentially of:
(a) preparing four starting powders, namely:
  i) a thallium oxide,
  ii) a calcium carbonate,
  iii) a strontium carbonate, and
  iv) a copper oxide;
(b) measuring said starting powders at a mole ratio of 1 : 0.67–1.5 : 0.5–1.5 : 0.67–3.0 between said thallium oxide powder : said calcium carbonate powder : said strontium carbonate powder : said copper oxide powder;
(c) mixing said measured calcium carbonate powder, said measured strontium carbonate powder and said measured copper oxide powder to provide a second powder;
(d) primarily calcining said second powder at a temperature of 850° C. to 1050° C. to form a Ca—Sr—Cu—O based oxide;
(e) mixing said measured thallium oxide powder and a powdered said Ca—Sr—Cu—O based oxide from step (d) to provide a third powder;
(f) secondarily calcining said third powder at a temperature of 400° C. to 720° C. to form a Bi—Ca—Sr—Cu—O based superconducting oxide powder;
(g) press-molding said Ti—Ca—Sr—Cu—O based superconducting oxide powder to form a pressed body; and
(h) thirdly calcining said pressed body at a temperature of 400° C. to 890° C.

6. A process for producing Tl—Ca—Sr—Cu—O based superconducting ceramics consisting essentially of:
(a) preparing four starting powders, namely:
  (i) a thallium oxide,
  ii) a calcium carbonate,
  iii) a strontium carbonate, and
  iv) a copper oxide;
(b) measuring said starting powders at a mole ratio of 1 : 0.67–1.5 : 0.5–1.5 : 0.67–3.0 between said thallium oxide powder : said calcium carbonate powder : said strontium carbonate powder : said copper oxide powder;

(c) mixing said measured calcium carbonate powder, said measured strontium carbonate powder and said measured copper oxide powder to provide a second powder;

(d) primarily calcining said second powder at a temperature of 850° C. to 1050° C. to form a Ca—Sr—Cu—O based oxide;

(e) mixing said measured bismuth oxide powder and a powdered said Ca—Sr—Cu—O based oxide from step (d) to provide a third powder;

(f) secondarily calcining said third powder at a temperature of 400° C. to 720° C. to form a Bi—Ca—Sr—Cu—O based superconducting oxide powder;

(g) hot-pressing said Tl—Ca—Sr—Cu—O based superconducting oxide powder under the pressure of 50 to 300 kg/cm$^2$ and at a temperature of 400° C. to 890° C.

7. A process for producing Tl—Ba—Ca—Cu—O based superconducting ceramics consisting essentially of:

(a) preparing four starting powders, namely:
i) a thallium oxide,
ii) a calcium carbonate,
iii) a barium carbonate, and
iv) a copper oxide;

(b) measuring said starting powders at a mole ratio of 1 : 0.67–1.5 : 0.5–1.5 : 0.67–3.0 between said thallium oxide powder : said calcium carbonate powder : said barium carbonate powder : said copper oxide powder;

(c) mixing said measured calcium carbonate powder, said measured strontium carbonate powder and said measured copper oxide powder to provide a second powder;

(d) primarily calcining said second powder at a temperature of 850° C. to 1050° C. to form a Ca—Sr—Cu—O based oxide;

(e) mixing said measured bismuth oxide powder and a powdered said Ca—Sr—Cu—O based oxide from step (d) to provide a third powder; and (f) secondarily calcining said third powder at a temperature of 400° C. to 720° C.

8. A process for producing Tl—Ba—Ca—Cu—O based superconducting ceramics consisting essentially of:

(a) preparing four starting powders, namely:
i) a thallium oxide,
ii) a calcium carbonate,
iii) a strontium carbonate, and
iv) a copper oxide;

(b) measuring said starting powders at a mole ratio of 1 : 0.67–1.5 : 0.5–1.5 : 0.67–3.0 between said thallium oxide powder : said calcium carbonate powder : said strontium carbonate powder : said copper oxide powder;

(c) mixing said measured calcium carbonate powder, said measured strontium carbonate powder and said measured copper oxide powder to provide a second powder;

(d) primarily calcining said second powder at a temperature of 850° C. to 1050° C. to form a Ca—Sr—Cu—O based oxide;

(e) mixing said measured thallium oxide powder and a powdered said Ca—Sr—Cu—O based oxide from step (d) to provide a third powder;

(f) secondarily calcining said third powder at a temperature of 400° C. to 720° C. to form a Bi—Ca—Sr—Cu—O based superconducting oxide powder;

(g) press-molding said Ti—Ca—Sr—Cu—O based superconducting oxide powder to form a pressed body; and (h) thirdly calcining said pressed body at a temperature of 400° C. to 890° C.

9. A process for producing Tl—Ba—Ca—Cu—O based superconducting ceramics consisting essentially of:

(a) preparing four starting powders, namely:
i) a thallium oxide,
ii) a calcium carbonate,
iii) a strontium carbonate, and
iv) a copper oxide;

(b) measuring said starting powders at a mole ratio of 1 : 0.67–1.5 : 0.5–1.5 : 0.67–3.0 between said thallium oxide powder : said calcium carbonate powder : said strontium carbonate powder : said copper oxide powder;

(c) mixing said measured calcium carbonate powder, said measured strontium carbonate powder and said measured copper oxide powder to provide a second powder;

(d) primarily calcining said second powder at a temperature of 850° C. to 1050° C. to form a Ca—Sr—Cu—O based oxide;

(e) mixing said measured thallium oxide powder and a powdered said Ca—Sr—Cu—O based oxide from step (d) to provide a third powder;

(f) secondarily calcining said third powder at a temperature of 400° C. to 720° C. to form a Tl—Ca—Sr—Cu—O based superconducting oxide powder;

(g) hot-pressing said Tl—Ba—Ca—Cu—O based superconducting oxide powder under the pressure of 50 to 300 kg/cm$^2$ and at a temperature of 400° C. to 890° C.

* * * * *